(12) United States Patent
Gordon et al.

(10) Patent No.: US 6,486,953 B1
(45) Date of Patent: Nov. 26, 2002

(54) ACCURATE REAL-TIME LANDING ANGLE AND TELECENTRICITY MEASUREMENT IN LITHOGRAPHIC SYSTEMS

(75) Inventors: Michael S. Gordon, Lincolndale, NY (US); John G. Hartley, Fishkill, NY (US); James D. Rockrohr, Hopewell Junction, NY (US); Maris A. Sturans, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 86 days.

(21) Appl. No.: 09/609,293

(22) Filed: Jun. 30, 2000

(51) Int. Cl.$^7$ .............................................. G01B 11/00
(52) U.S. Cl. ..................................................... 356/400
(58) Field of Search ............................... 356/399–401, 356/614, 615, 616; 250/548

(56) References Cited

U.S. PATENT DOCUMENTS

| | | | | |
|---|---|---|---|---|
| 4,631,416 A | * | 12/1986 | Trutna, Jr. | 250/548 |
| 4,791,302 A | * | 12/1988 | Nozue | 250/491.1 |
| 5,342,738 A | * | 8/1994 | Ikeda | 430/325 |
| 5,604,354 A | * | 2/1997 | Lauverjat | 250/548 |
| 6,023,338 A | * | 2/2000 | Barcket | 356/401 |

* cited by examiner

Primary Examiner—Michael P. Stafira
(74) Attorney, Agent, or Firm—Whitham, Curtis & Christofferson P.C.; Daryl K. Neff

(57) ABSTRACT

Motion of a block carrying a grid for backscattering portions of a pattern of charged particles incident on the grid is moved generally axially of a charged particle beam tool while the position of the block is measured, preferably to optically, with a grazing incidence laser beam or interferometer, in the axial direction for any or all of the degrees of freedom of the block. Backscatter is correlated with known grid position to correct the backscatter measurement to compensate for lateral components of motion parallel to the target plane in measurement of actual beam position at different axial locations. Telecentricity and landing angle can thus be observed to an accuracy of 0.003 milliradians in substantially real time; permitting substantially real time adjustment thereof. The basic principles of this process and apparatus can be extended to measurement of numerical aperture and are equally applicable to probe-forming and beam projection lithography tools.

18 Claims, 5 Drawing Sheets

ACCURATE REAL-TIME LANDING ANGLE AND TELECENTRICITY MEASUREMENT IN LITHOGRAPHIC SYSTEMS

BACKGROUND OF THE INVENTION

1. Field of the Invention

The present invention generally relates to charged particle beam tools and, more particularly, to real-time measurements for adjustments of charged particle beam tools, especially electron beam lithography systems.

2. Description of the Prior Art

Charged particle beam tools are known and used for numerous purposes including electron microscopy and lithographic exposures using charged particles such as for the manufacture of semiconductor integrated circuits. In the latter case, in particular, demands for increased integration density and reduction of size of elements of integrated circuits have required electron beam exposures of resists when deep ultraviolet light exposures have become inadequate to support minimum feature sizes required by current and foreseeable integrated circuit designs. Given the requirement for such high resolution in order to obtain the benefits of improved performance and functionality as well as increased manufacturing economy, high performance is required from charged particle (e.g. electron) beam exposure systems.

Electron beam exposure systems generally fall into two general types: probe-forming systems in which a single spot, generally of a selected shape, is exposed at a time at a high repetition rate and electron beam projection systems in which a sub-field pattern defined in a reticle sub-field is projected onto a target and sequential exposures of different sub-fields are made across the chip area. Electron beam projection lithography systems have much increased throughput relative to probe-forming systems by greatly increasing the number of pixels which can be simultaneously exposed. In both of these types of systems, high positional accuracy and shape fidelity are required to obtain the desired pattern of exposure, particularly to achieve proper stitching together of individual exposures.

While electron beam lithography systems have become highly sophisticated and are capable of high accuracy and fidelity through utilization of a number of electron-optical elements such as lenses, deflectors, dynamic correction elements and the like, none of these elements can be perfectly fabricated or fully modeled theoretically. Therefore, it is necessary to adjust and/or align the elements and their driving circuits or the beam relative to the elements to optimize performance of the tool. Some adjustments may be made in real-time and more-or-less elaborate protocols have been developed to achieve optimum alignment in regard to some operating parameters of the tool. Other parameters have presented persistent practical problems in making real-time adjustments based on real-time performance measurements.

When real-time measurements cannot be made, operation of the tool must be interrupted while a measurement is made through some other facility, such as withdrawing an exposed, resist-coated wafer from the tool, developing the resist and evaluating the patterned features formed in the resist. Of course, such interruption of operation is not only time-consuming but may introduce additional errors or sources of error into the adjustment of the tool.

Two key parameters of charged particle beam tool performance are telecentricity and landing angle. Landing angle should ideally be perpendicular to the target plane and deviations therefrom introduce field translation errors as a function of height of an image location from the plane of best focus. Deviation from telecentricity is manifested as variation of landing angle with deflection and can cause magnification and/or rotation of the deflected field as a function of height. These image aberrations can generally be quantitatively evaluated only by inspection of images in resist.

However, one attempt at a real-time measurement of deviations from telecentricity and perpendicular landing angle which has been attempted involved a grid mounted on a piezoelectric transducer which was intended to provide translation of the grid in the axial direction of the tool. The beam was scanned in an "L" shaped pattern in the x and y directions and the resulting differentiated backscattered beam was displayed on a spot monitor while the piezoelectric transducer was driven with a square wave pulse. The spot monitor could thus display the backscattered beam from the grid at the two axial locations of the grid and alignment of the electron beam could be adjusted with a goal of minimizing or eliminating the positional shift of the backscattered beam. This, in theory, could be used to confirm the landing angle of the beam. If the beam was further deflected, adjustments in deflection could, in theory, be made such that the landing angle was independent of deflection.

As a practical matter, this technique was unsuccessful due to an unavoidable component of lateral motion of the grid; from which deviations from telecentricity and/or perpendicular landing angle were indistinguishable from the grid translation. In other words, any lateral component of motion of the grid as the grid was driven in the z-direction would result in total grid displacement other than perpendicular to the target plane. Thus, adjustment to minimize positional changes in the image of the backscattered beam as the grid was moved would assure a corresponding deviation from telecentricity and landing angle to conform the beam trajectory to the grid motion.

The only solution proposed for this inherent problem was to apply mechanical stops to limit lateral grid motion. However, it proved impossible to constrain lateral grid motion to a level that would assure negligible influence on the result. The more recent increased accuracy requirements imposed by incresed integration density and reduced device size render this technique even more unacceptable for a real-time measurement of telecentricity and/or landing angle.

SUMMARY OF THE INVENTION

It is therefore an object of the present invention to provide a technique for measurement of telecentricity and landing angle of a charged particle beam in substantially real time to facilitate adjustment of a charged particle beam tool.

It is another object of the invention to provide for increased exposure accuracy and fidelity in electron beam lithography tools In order to accomplish these and other objects of the invention, a charged particle beam system and method are provided including an arrangement or step for moving a block in a direction generally perpendicular to a target plane of the charged particle beam system, a grid carried by the block and capable of backscattering a portion of a pattern of charged particles incident thereon, optical means for measuring position on the block, a sensor arrangement for measuring backscatter of charged particles from the grid, and an arrangement for correlating charged particle backscatter with positions of the block and computing position of a charged particle beam at different positions of the block along an axis of said charged particle beam system.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
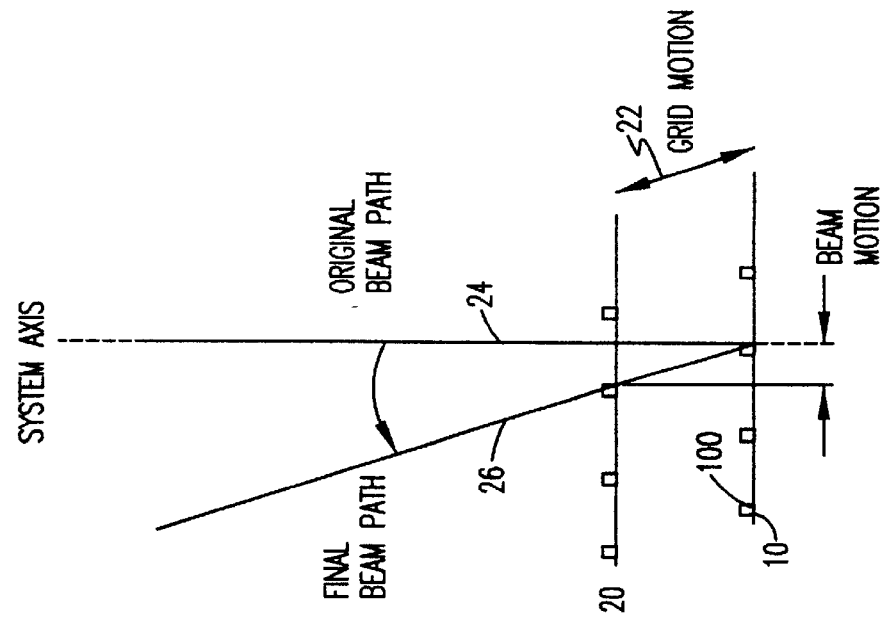
FIGS. 1 and 2 illustrate the effects of deviations from telecentricity and perpendicular landing angle useful for explaining measurement problems addressed by the invention.
Figure 2:
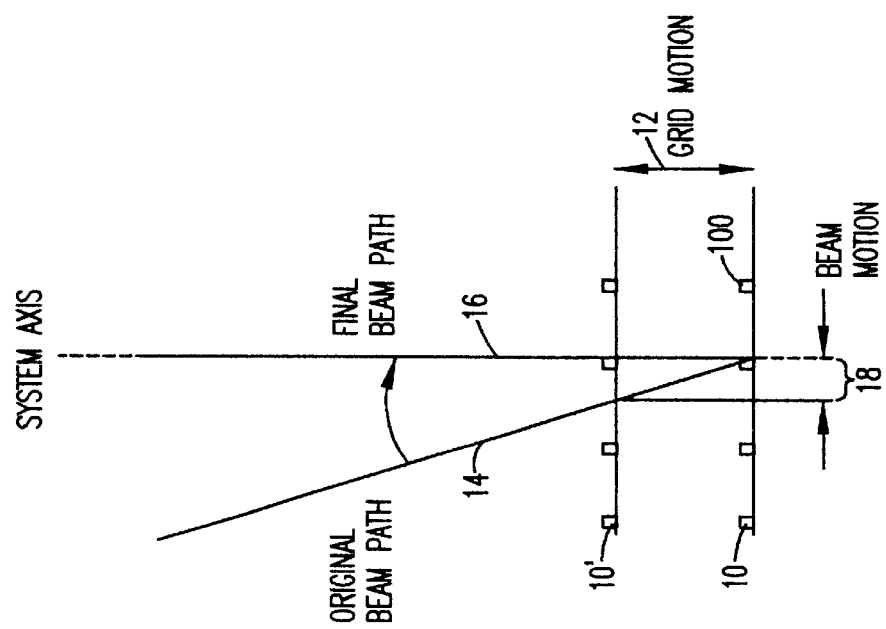

Referring now to the drawings, and more particularly to FIGS. 1 and 2, there is shown a side view of a charged particle beam target including a grid with a charged particle beam incident thereon. It should be understood that these Figures are arranged to facilitate an explanation of the problems addressed by the invention and the solution provided thereby. For that reason, while these Figures may also be considered to represent some aspects of the prior attempt at real-time measurement of telecentricity and landing angle alluded to above, no portion of either FIG. 1 or FIG. 2 is admitted to be prior art in regard to the present invention.

While deviations from telecentricity and perpendicular landing angle have different deleterious effects on the image, they are related in some respects. That is, while the axis of a charged particle beam may be precisely perpendicular to a target surface, variance from telecentricity will cause an increasing variance from perpendicular of the trajectory of charged particles with distance along the target surface from the beam axis (e.g. as the beam is deflected). Conversely, a landing angle which is not perpendicular to the target may occur even it the charged particle beam is telecentric. It is necessary for currently acceptable performance to confirm a perpendicular landing angle across the entirety of the beam deflection to concurrently achieve both telecentricity and perpendicular landing angle.

It can be readily understood that if a beam position (either static or deflected) is the same at different axial locations along the beam path near the target or image plane, telecentricity and perpendicular landing angle are assured, on average. This ideal scenario and adjustment to achieve it is depicted in FIG. 1 for the static case. In FIG. 1, a grid 100 of preferably high atomic weight metal is provided at a nominal target plane 10. Increased atomic weight of the material comprising the grid increases the efficiency of backscatter of charged particles such as electrons incident thereon. Backscatter can be measured using any of several techniques well-understood in the art, such as using a semiconductor device above the grid. Accordingly, a backscatter sensor is shown schematically in FIG. 5 and need not be discussed in detail.

While details of the grid geometry are not particularly important to the successful practice of the invention, the width of a grid bar is preferably several times larger than the transverse dimension of the beam and the spacing between grid bars is preferably about ten times the transverse dimension of the beam. The scanning of the beam is preferably performed electrostatically over a range several times the spacing of the grid bars As mentioned above, the beam is preferably scanned in an L-shaped or other two dimensional pattern across the grid. If grid 100 is moved in an ideal path perpendicular to the target plane 10 by a relatively small distance 12 to position 10', the time at which the beam crosses the bars of the grid will depend on the angle of the beam relative to grid motion.

Therefore, if ideal motion 12 can be obtained, the electron beam tool can, in theory, be adjusted such that no (or negligible) change in the time the beam crosses a grid bar is detected with grid motion to achieve telecentricity and perpendicular landing angle. However, in practice, mechanisms suitable for producing grid motion invaribly introduce some component of lateral motion parallel to the target plane, as depicted at 22 of FIG. 2. Rotational components of motion referred to hereinafter as roll, pitch and yaw are also likely to be introduced, particularly if mechanical contraints are placed on grid motion (as in the known approach discussed above) but are omitted from FIG. 2 in the interest of clarity (but are reflected in FIGS. 3 and 4). If the motion 22 of grid 100 is not ideal as shown at 12 of FIG. 1, the adjustment procedure described above will cause alignment of the original beam path 24 (shown, for clarity, as having a perpendicular landing angle) to coincide with grid motion 22, as shown at 26. Therefore, the known approach to achieving real time measurement of telecentricity and landing angle to facilitate adjustment of those beam parameters is not, in fact, capable of doing so.

Figure 3:
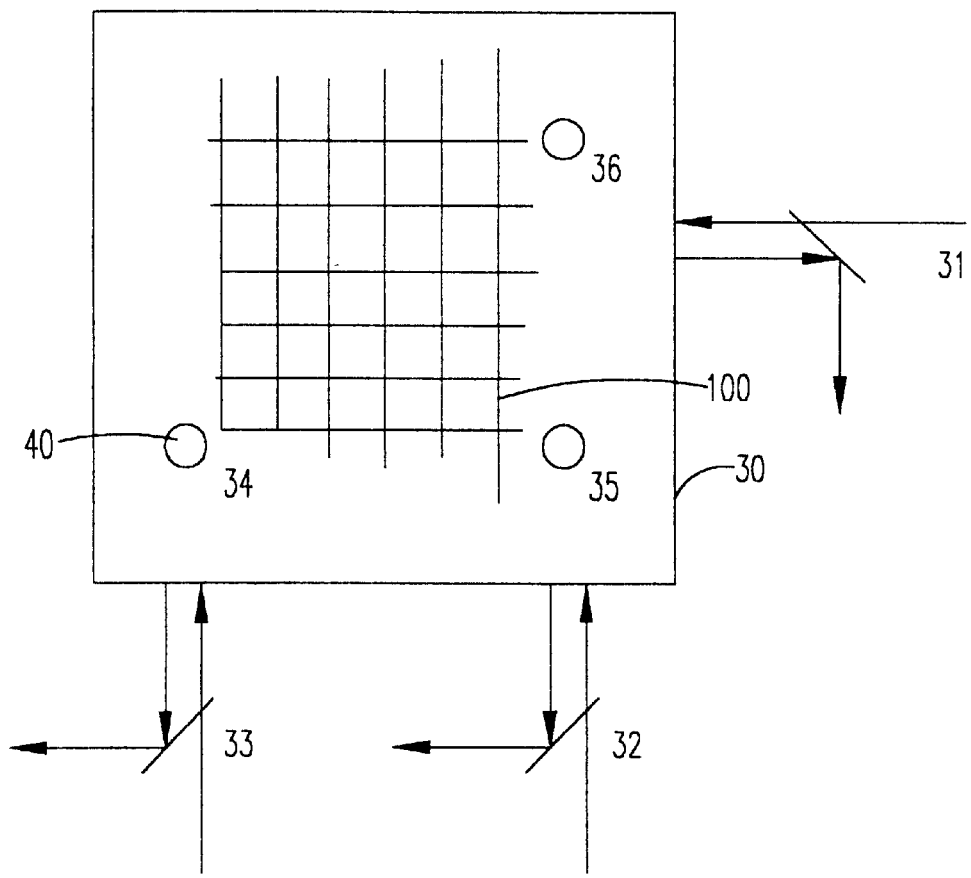
FIGS. 3 and 4 are top and side views, respectively, of a wafer or grid supporting translation table including preferred laser interferometer measurement arrangements in accordance with the invention.
Figure 4:
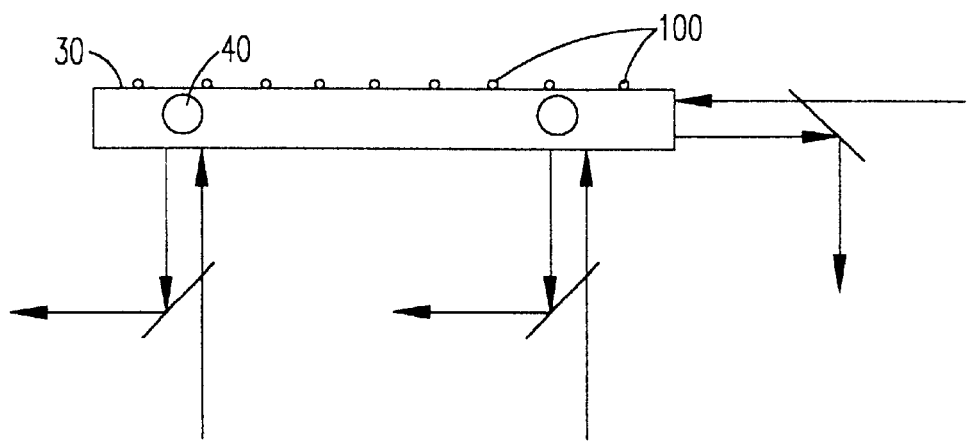

Referring now to FIGS. 3 and 4, the invention will now be explained. It should be noted, as alluded to above, that the circumstances of uncontrolled and/or unavoidable components of grid motions shown in FIG. 2 will also be present in a charged particle beam tool system including the invention and FIG. 2 is thus not admitted to be prior art in regard to the invention, particularly to any extent that the deficiencies of the known approach to such measurements may not be similarly known, recognized or described in the literature.

In accordance with a preferred form of the invention, grid 100 is mounted on a block 30 preferably supporting a plurality of mirrors 40 which are preferably components of interferometers 31–36. other types of dimensional or location sensors are known and usable in the practice of the invention, some of which will be discussed below. However, optical laser interferometers, particularly operating at relatively short wavelengths are preferred for highest currently available resolution at practical cost relative to the environment in which they are to operate.

The nature and composition of plate 30 is not of particular importance to the practice of the invention except that it should be flat over the dimensions of the grid pattern. For example, plate 30 could be a plate which can be mounted on a wafer chuck of any desired type in the same manner as a wafer or could comprise the wafer chuck itself or any attachment thereto or even a translation table carrying the wafer chuck.

In this latter regard, it should be understood that a translation table providing motion in the X and Y directions (parallel to the target plane) is included in electron beam projection lithography systems and probe-forming systems and may include motion and/or position transducers to assure arrival at a desired position or compensation for any errors in position (e.g. by providing a slight corrective deflection to the beam). For electron beam projection systems, it is also known (but not admitted to be prior art) to provide similar motion (but on a smaller scale) in the Z direction to partially or fully compensate for tilt or bow of the wafer or substrate being exposed. For these purposes, a range of about 50–100 μm has generally been found adequate.

The invention, however, preferably provides sensing of position in regard to all six (x, Y, Z, roll, pitch and yaw) degrees of freedom of plate 30 and preferably higher positional resolution so that all information in regard to positions 10 and 10' and the motion therebetween can be known to a high accuracy. From this information, the changes in the position of the beam as it is scanned across grid 10 due to grid motion can be corrected in substantially real time to allow adjustment of the charged particle beam to achieve accurate telecentricity and perpendicular landing angle regardless of non-ideal motion of the grid 100. The compensation computation can be carried out in a number of ways which will be apparent to those skilled in the art in view of the following discussion.

Specifically, using laser interferometers 31–36 respectively including three mirrors 40 placed on one surface of the block 30 (e.g. 34, 35, and 36 to reflect generally in the Z-direction, two (e.g. 32 and 33) on a second side and one (e.g. 31) on a third side (all reflecting generally in the X or Y direction), movement in all six possible degrees of freedom can be measured. (Hereinafter, the same reference numeral will be used for both the mirror and interferometer including it.) Accordingly, in the exemplary configuration illustrated, interferometer 31 will directly measure any component of motion in the x direction. The component of motion in the Y and Z directions can be derived from the measurements from interferometers 32, 33 and 34, 35 36, respectively (e.g. as averages of the measurements). Likewise, the difference of interferometers 32, 33 measures yaw; 35, 36 measures pitch; and 35, 34 measures roll, respectively.

If laser interferometers are used, as is preferred, these components of motion will be known with high accuracy approaching or exceeding 1.0 nm at positions 10 and 10' and the grid motion therebetween for all degrees of freedom. Accurate physical constraints are no longer necessary since location of the grid at a specified location is not required by virtue of the actual location being accurately determinable.

The residual motion of a beam being scanned over the grid moving in the X-direction is sufficient to adjust telecentricity and landing angle. Conversely residual motion of the grid along path 22 (FIG. 2) in connection with static features on the grid is sufficient for the same purpose. It should also be appreciated that if the end points of path 22 are accurately known, a correction from path 26 to path 24 (FIG. 2) can be readily computed and corrected. Further, the change in the position of the beam in response to any adjustment of the beam alignment can be used to readily compute, for any grid geometry and path 22, the position of the beam which would characterize desired telecentricity and landing angle to which the tool can be adjusted to provide. In other words, relative motion of the beam and the grid and the change in position of the beam are unconditionally sufficient to measure telecentricity and landing angle when the position of the grid is accurately known at two positions in regard to all six degrees of freedom.

Figure 5:
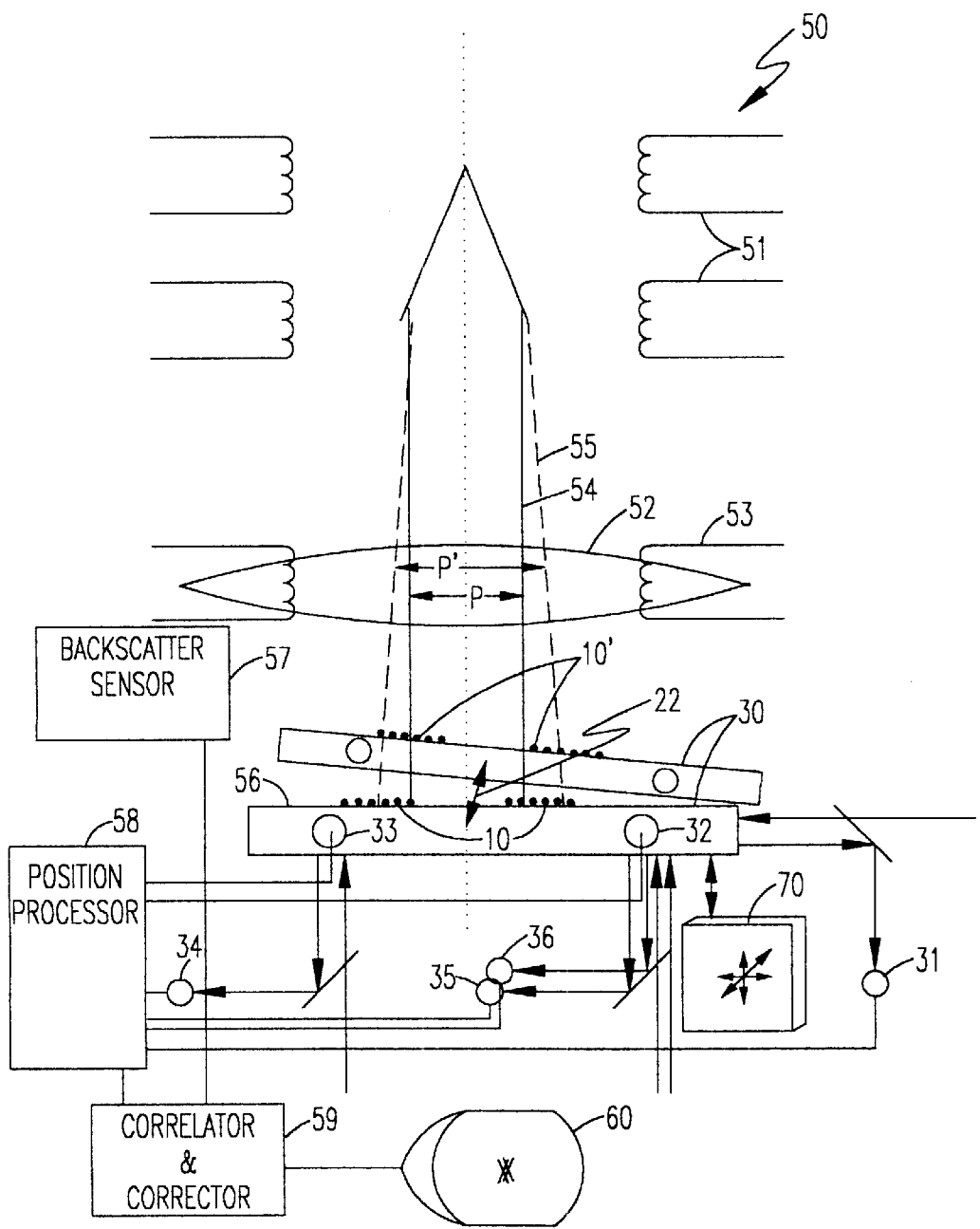
FIG. 5 is a schematic side view of a charged particle beam tool including the invention.

Implementation of the invention is schematically shown in FIG. 5 which illustrates an exemplary electron beam column 50 in cross-section. For clarity, only the predeflectors 51, projection lens 52 and variable axis immersion lens deflector 53 are illustrated as representative of numerous electron optical elements (e.g. other lenses and deflectors, stigmators, focus correctors and the like) which may be included in various beam column designs; the details of which are unimportant to the practice of the invention. Likewise only telecentric (54) and non-telecentric (55) deflection cases and an undeflected beam 62 are shown for clarity. It will be recognized that the arrangement of FIG. 4 is placed at the nominal target plane 56 with block 30 also depicted at a second, arbitrary position separated from the nominal position by a distance depicted by arrow 22 (all corresponding to correspondingly identified depictions in FIGS. 2 and 3).

From FIG. 5, it can be readily seen that the motion 22 of block 30 will cause a substantial shift in the position of grid 10, 10' and change in the detected position of the beam as detected by backscatter detector 57 as the beam is scanned across the grid. However, since the location of grid 10 on block 30 is known and the position of block 30 can be accurately determined from interferometers 31–36 or other position or motion sensors as computed by position processor 58, the position of the beam can be correlated with position of the grid and correction for ideal motion can be interpolated, as schematically depicted at 59 in accordance with any suitable algorithm such as those alluded to above. The corrected result for two (or more) block positions separated by ideal motion perpendicular to the target plane can thus be displayed, for example, on display 60 in any convenient format to allow real time adjustment of the beam column to achieve desired telecentricity and landing angle.

Figure 6:
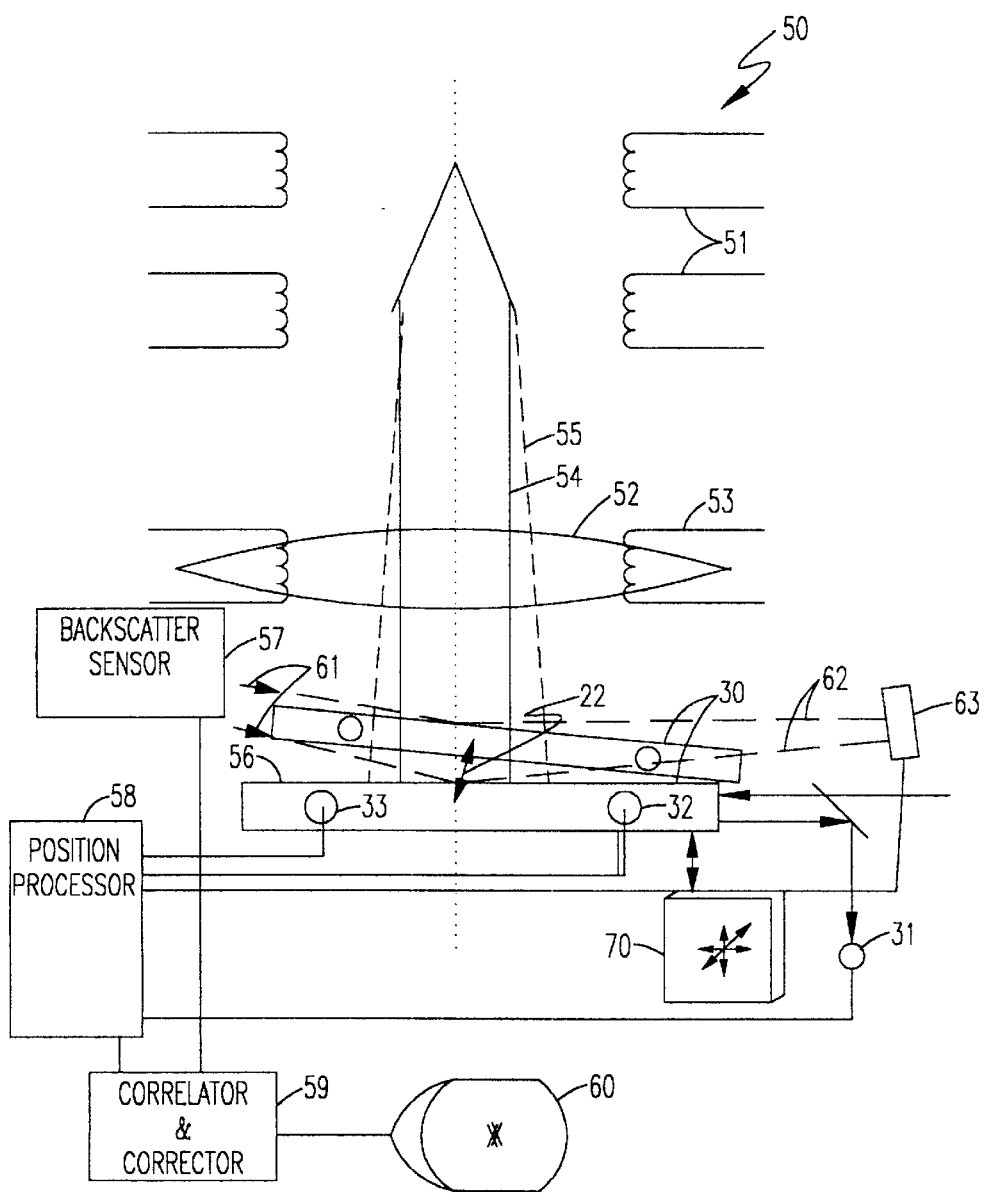
FIG. 6 is a schematic side view of a charged particle beam tool including a variant form of the invention.

An alternative embodiment of the invention will now be discussed in connection with FIG. 6. It should also be appreciated from the following discussion that the use of interferometers having a resolution of about 1.0 nm provides much improved results but that results of sufficient accuracy to support real time adjustments may be based on much less extensive or accurate positional data. The positional uncertainty of this alternative embodiment nevertheless allows achievement of desired telecentricity and landing angle with accuracy that is effective to reduce pattern placement errors beyond practical limits of other electron-optical adjustments and corrections.

As noted above, a charged particle beam tool of current design will generally include sensors corresponding to interferometers 31–33 of FIG. 5 and processors for evaluating the motion of a water (corresponding to block 30) in the X, Y and yaw directions. Thus FIG. 6 differs from FIG. 5 in the omission of interferometers 34–36. In accordance with a variant form of the invention, a series of relatively simple sensors can be added to detect position of block 30 in the z direction using a directional light source 61 such as a laser and sensor 63 to detect light reflected at a grazing angle from the surface of block 30. Three sensors of this type can be used alternatively to interferometers 34–36 so that motion in all six degrees of freedom can be determined Alternatively, a single Z-axis position sensor may be used together with interferometers 31–33 and motion in four degrees of freedom measured. Such sensors can achieve a resolution of about 50 nm which is sufficient to the practice of the invention to allow real time adjustment of telecentricity and landing angle to within 0.2 milliradians for a height change of 250 μm. This angular uncertainty is nevertheless sufficient to support image placement requirements consistent with critical dimensions of 0.1 micron and somewhat smaller with the alternative embodiment of the invention and calculating position based on measurement of position in only four degrees of freedom (although measurement in six degrees of freedom can be easily made available). By way of comparison, the preferred embodiment of the invention using interferometers having a 1.0 nm resolution for all six degrees of freedom will support adjustment of telecentricity and landing angle to an accuracy of 0.004 milliradians which will support image placement requirements consistent with minimum feature sizes of very small fractions of a micron. of course, the accuracy of this technique is also dependent on the accuracy of end points of translation stage motion as well as determination of the position of the beam with respect to the grid bars.

It will be appreciated by those skilled in the art that the above technique and apparatus for real time telecentricity and landing angle measurement are equally applicable to probe forming and beam projection lithography tools. However, some refinements can provide enhanced performance and additional functionality in the context of a beam projection tool.

For projection electron beam lithography, the beam which illuminates the reticle subfields is slightly larger than the one mm patterned area of the reticle. The subfield is then demagnified 4× so the resulting subfield size at the wafer plane is 0.25 mm. This beam is about 100 times larger than, the beam striking the wafer in a probe beam lithography tool, which presents challenges in accurately determining where in the scan, the beam crosses the grid 10.

In a simple approach, which, illustratively, could be used to measure the landing angle and/or telecentricity of the beam at the reticle plane, the grid 10 could be replaced by a one mm square hole at the reticle plane, or a 0.25 mm square hole at the wafer plane. The beam would be scanned over the target as described earlier, and either the backscattered, or the transmitted beam could be recorded as a function of the scan as the grid is translated axially 22. The accuracy with which the position of the edge of the 0.25 mm square hole could be determined as a function of the scan of the beam, and axial position of the hole, would be limited due to the inevitable surface roughness and straightness of the edge of the large aperture which would be expected to be large over the distance of 0.25 $\mu$m. This is in contrast to the probe beam application where the grid 10 needs to be smooth and straight over distances of about 2 $\mu$m.

Alternatively, a subfield containing a small square hole of roughly 8–10 $\mu$m could be illuminated and the beam transmitted through the hole made to scan over a grid 10 similar to that used in the probe-style approach described above. This approach would have poor accuracy in the determining the landing angle and/or telecentricity due to the proportionately smaller amount of beam current (approximately $1/10^4$) that would be transmitted by the reticle to strike the grid 10.

Figure 7:
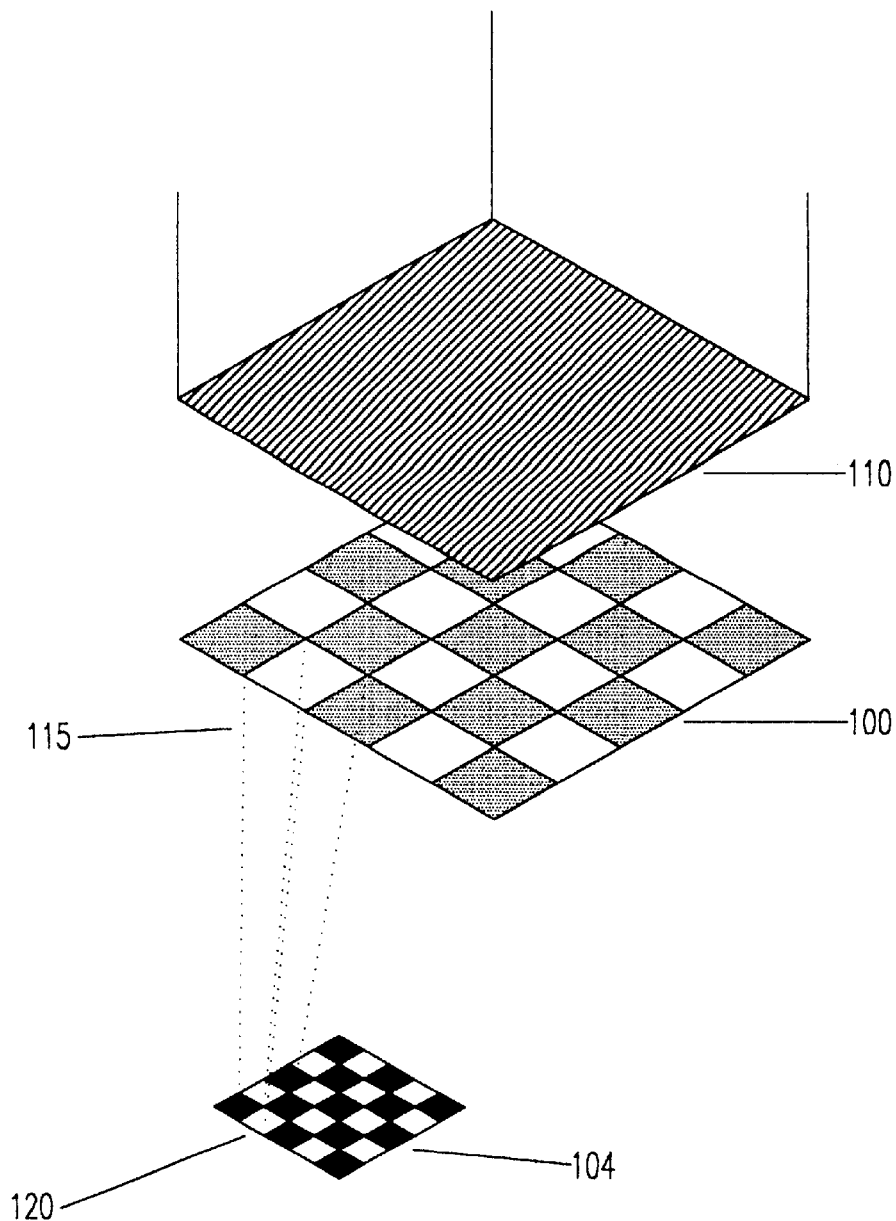
FIG. 7 is a schematic view of a reticle and wafer target combinationthat can be used in the application of the invention to an electron beam projection lithography system.

An approach that has been proposed to measure the beam resolution uses a reticle and matched grid 10 at the wafer plane. The reticle and grid have a checkerboard appearance and can be of either matched or complementary style. That is, the reticle and grid can have exactly the same geometry of opaque and clear areas, as shown in FIG. 7, or the reticle and grid can have the clear and opaque areas out of phase or reversed with respect to each other. The grid 104 is preferably four times smaller than the reticle subfield 100, and in the matched case, the lithography to fabricate the grid can be done in the projection tool itself. This has the advantage that the grid and reticle will have identical distortions and shape. The reticle will have a transmission of nearly one-half. Also shown in FIG. 7 is the illumination beam 110 impinging on the reticle subfield 100. A section of the illumination beam 110, falling through one section of opaque area of the subfield 115 and the corresponding part of the opaque area of the grid 120 is shown as well.

For measuring landing angle and telecentricity in projection lithography tools, the beam falling through the reticle subfield is scanned over the grid as the grid is translated axially. The reticle subfield 100, and matching grid 104 could be moved laterally, by their respective stages, in synchronism with the beam deflection at the reticle and wafer planes to minimize the errors associated with scanning the different grids depending on the magnitude of the beam deflection.

A further application of this invention is that it can be applied to the measurement of the numerical (convergence) angle of the beam. In this case, the change in spot size as a function of the distance from the plane of best focus yields twice the numerical aperture. The size of the beam can be determined by scanning the beam over the grid of known width or scanning the beam far enough to cross two grid targets of known spacing.

In view of the foregoing, it is seen that the invention provides for accurate real time measurement and adjustment of beam telecentricity and landing angle in charged particle beam systems. The invention supports improved image accuracy and fidelity to support smaller regimes of minimum lithographic feature sizes and can be extended to other useful measurements and/or adjustments of charged particle beam systems.

While the invention has been described in terms of a single preferred embodiment, those skilled in the art will recognize that the invention can be practiced with modification within the spirit and scope of the appended claims

What is claimed is:

1. A charged particle beam system including
   means for moving a block in a direction generally perpendicular to a target plane of said charged particle beam system from a first position to a second position,
   a grid carried by said block adapted to backscatter a portion of a pattern of charged particles incident thereon,
   detectors adapted to measure said first and said second positions of said block,
   means for measuring backscatter of charged particles from said grid, and
   means for correlating charged particle backscatter at said first and said second positions of said block with measurements of said first and said second positions, and for computing position of a charged particle beam corrected to said measurements, said computed beam position being corrected for motion of said block in directions other than perpendicular to said target plane, such that landing angle and telecentricity of said charged particle beam are determinable from said computed beam position.

2. A system as recited in claim 1, wherein said block comprises a wafer chuck.

3. A system as recited in claim 1, wherein said block is mounted on a wafer chuck.

4. A system as recited in claim 1, wherein said means for moving said block includes
   a translation stage.

5. A system as recited in claim 1, wherein said means for measuring position of said block includes a plurality of laser interferometers.

6. A system as recited in claim 1, wherein said means for measuring position of said block includes a directional light source directed at a grazing angle to a surface of said block.

7. A system as recited in claim 1, wherein said means for measuring backscatter includes a semiconductor device above said grid.

8. A system as recited in claim 1, further including
a display for displaying data representing a position of of said beam at different axial locations of said system.

9. A system as recited in claim 1, wherein said system is a probe forming electron beam system.

10. A system as recited in claim 1 wherein said system is an electron beam projection lithography tool.

11. A system as recited in claim 10, further including a reticle having a pattern of opaque and transparent areas and wherein said grid is patterned in accordance with said pattern of said reticle.

12. A system as recited in claim 11, wherein open areas of said grid correspond to said opaque areas of said reticle.

13. A system as recited in claim 11, wherein open areas of said grid correspond to said transparent areas of said reticle.

14. A system as recited in claim 12, wherein said grid is formed lithographically using said reticle.

15. A system as recited in claim 11, wherein said pattern is a checkerboard pattern.

16. A method of measuring landing angle and telecentricity in a charged particle beam system, said method comprising steps of moving a block, caring a grid capable of backscattering charged particles incident thereon, in a direction generally perpendicular to a target plane of said charged particle beam system from a first position to a second position, measuring said first and said second positions of said block, measuring backscatter of charged particles from said grid, and correlating charged particle backscatter at said fist and said second positions of said block with measurements of said first and said second positions, and computing position of a charged particle beam corrected to said measurements, said computed beam position being corrected for motion of said block in directions other than perpendicular to said target plane, and determining landing angle and telecentricity of said charged particle beam from said computed beam position.

17. A system as recited in claim 1 wherein said detectors are adapted to measure said first and said second positions in at least four degrees of freedom including at least one selected from the group consisting of roll, pitch and yaw.

18. A system as recited in claim 17 wherein said detectors are adapted to measure said first and said second positions in six degrees of freedom including roll, pitch and yaw.

* * * * *